United States Patent
Bang et al.

(10) Patent No.: US 9,583,709 B2
(45) Date of Patent: Feb. 28, 2017

(54) MASK FOR FORMING ORGANIC LAYER PATTERN, FORMING METHOD OF ORGANIC LAYER PATTERN, AND MANUFACTURING METHOD OF ORGANIC LIGHT EMITTING DIODE DISPLAY USING THE SAME

(71) Applicant: Samsung Display Co., Ltd., Yongin, Gyeonggi-do (KR)

(72) Inventors: Hyun Sung Bang, Bucheon-si (KR); Jae Sik Kim, Hwaseong-si (KR); Yeon Hwa Lee, Yongin-si (KR); Joon Gu Lee, Seoul (KR); Ji Young Choung, Yongin-si (KR); Jin Baek Choi, Anyang-si (KR); Kyu Hwan Hwang, Yongin-si (KR); Young Woo Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 14/532,993

(22) Filed: Nov. 4, 2014

(65) Prior Publication Data

US 2015/0270486 A1 Sep. 24, 2015

(30) Foreign Application Priority Data

Mar. 18, 2014 (KR) ........................ 10-2014-0031857

(51) Int. Cl.
*H01L 51/00* (2006.01)
*G03F 1/52* (2012.01)
(Continued)

(52) U.S. Cl.
CPC ............ *H01L 51/0011* (2013.01); *G03F 1/52* (2013.01); *G03F 7/20* (2013.01); *H01L 51/0013* (2013.01); *H01L 51/56* (2013.01)

(58) Field of Classification Search
CPC ............................. H01L 51/0011; H01L 51/56
See application file for complete search history.

(56) References Cited

U.S. PATENT DOCUMENTS

| | | | |
|---|---|---|---|
| 6,610,455 B1 * | 8/2003 | Burberry | H01L 51/0013 430/200 |
| 2004/0100700 A1 * | 5/2004 | Kitamura | B29D 11/00278 359/622 |

(Continued)

FOREIGN PATENT DOCUMENTS

| JP | 5291607 B2 | 9/2013 |
|---|---|---|
| KR | 10-0635569 B1 | 10/2006 |
| KR | 10-0782470 B1 | 12/2007 |

OTHER PUBLICATIONS

EPO Search Report dated Jul. 31, 2015, for corresponding European Patent application 14196461.9, (7 pages).

*Primary Examiner* — Charles Garber
*Assistant Examiner* — Ankush Singal
(74) *Attorney, Agent, or Firm* — Lewis Roca Rothgerber Christie LLP

(57) ABSTRACT

A mask for forming an organic layer pattern, the mask including a photomask having a first substrate and a reflecting layer on the first substrate; and a donor substrate on the photomask and separated therefrom, the donor substrate including a second substrate and an absorption part on the second substrate, wherein the photomask comprises a reflecting part configured to reflect light incident to the photomask and a light concentrating part configured to concentrate the light and transmit the light to the donor substrate.

10 Claims, 9 Drawing Sheets

(51) Int. Cl.
*G03F 7/20* (2006.01)
*H01L 51/56* (2006.01)

(56) References Cited

U.S. PATENT DOCUMENTS

| | | | |
|---|---|---|---|
| 2004/0257496 A1* | 12/2004 | Sonoda | G02F 1/133526 |
| | | | 349/95 |
| 2006/0215269 A1* | 9/2006 | Abe | G02B 3/0012 |
| | | | 359/619 |
| 2008/0026543 A1* | 1/2008 | Miyairi | H01L 27/1266 |
| | | | 438/455 |
| 2008/0080068 A1* | 4/2008 | Maeno | B29D 11/00365 |
| | | | 359/811 |
| 2009/0075214 A1* | 3/2009 | Hirakata | H01L 51/0013 |
| | | | 430/319 |
| 2009/0104835 A1* | 4/2009 | Aoyama | H01L 51/0013 |
| | | | 445/58 |
| 2009/0142510 A1 | 6/2009 | Takahashi et al. | |
| 2009/0169809 A1* | 7/2009 | Yokoyama | H01L 51/0013 |
| | | | 428/138 |
| 2009/0269509 A1* | 10/2009 | Yokoyama | C23C 14/12 |
| | | | 427/554 |
| 2009/0279179 A1* | 11/2009 | Tanaka | C23C 14/12 |
| | | | 359/619 |
| 2010/0015424 A1* | 1/2010 | Seo | H01L 51/0013 |
| | | | 428/216 |
| 2010/0084676 A1 | 4/2010 | Tanaka | |
| 2010/0123260 A1* | 5/2010 | Duparre | B29D 11/00365 |
| | | | 264/1.38 |
| 2010/0151762 A1 | 6/2010 | Ikeda et al. | |
| 2011/0090425 A1* | 4/2011 | Nakagome | G02F 1/133606 |
| | | | 349/64 |
| 2013/0002793 A1 | 1/2013 | Kim | |

* cited by examiner

MASK FOR FORMING ORGANIC LAYER PATTERN, FORMING METHOD OF ORGANIC LAYER PATTERN, AND MANUFACTURING METHOD OF ORGANIC LIGHT EMITTING DIODE DISPLAY USING THE SAME

CROSS-REFERENCE TO RELATED APPLICATION

This application claims priority to and the benefit of Korean Patent Application No. 10-2014-0031857 filed in the Korean Intellectual Property Office on Mar. 18, 2014, the entire contents of which are incorporated herein by reference.

BACKGROUND

1. Field

The described technology relates generally to a mask for forming an organic layer pattern, a method for forming an organic layer pattern by using the same, and a method for manufacturing an organic light emitting diode display.

2. Description of the Related Art

An organic light emitting diode display typically includes two electrodes and an organic emission layer positioned therebetween, wherein an electron injected from one electrode and a hole injected from the other electrode are coupled with each other in the organic emission layer to generate an exciton which emits energy to emit light.

A manufacturing process of the organic light emitting diode display sometimes includes a process of forming a plurality of layer patterns on a substrate. The layer patterns may be formed by various methods such as inkjet printing, screen printing, and photolithography.

Particularly, when the layer is an organic layer including an organic material, the organic material is very sensitive to oxygen and water such that a general method, such as photolithography, for forming an inorganic layer pattern may not be used. The organic layer pattern may be formed through a printing process using an inkjet, a spinner, a nozzle, etc., a deposition and patterning process, a deposition process using a shadow mask, a transfer process using heat, or a laser.

As described above, the transfer process among the several methods for forming the organic layer pattern is widely used as a method for forming the layer pattern on a larger substrate with a low cost and simplicity.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a mask for forming an organic layer pattern while increasing application efficiency and a use amount of an organic layer material, a method for forming the organic layer pattern by using the same, and a manufacturing method of the organic light emitting diode display.

A mask for forming an organic layer pattern according to an exemplary embodiment includes: a photomask including a first substrate and a reflecting layer formed on the first substrate; and a donor substrate positioned on the photomask to be separated therefrom and including a second substrate and an absorption part formed on the second substrate, wherein the photomask includes a reflecting part reflecting light incident to the photomask and a light concentrating part concentrating the light to transmit the light to the donor substrate.

The reflecting part and the light concentrating part may be alternately disposed.

A plurality of light concentrating patterns may be formed at the light concentrating part among a surface of the first substrate, the light concentrating pattern may have an intaglio shape, the intaglio shape may be a cross-section of a concave semicircular shape, the intaglio shape may have a cross-section of a convex semicircular shape, and the intaglio shape may have a cross-section of a concave triangular shape.

The light concentrating pattern may have an embossed carving shape, and the embossed carving shape may be a convex semicircle shape.

The reflecting layer may be formed at the reflecting part.

A method of forming an organic layer pattern according to an exemplary embodiment includes: coating an organic layer on an absorption part of a mask for forming an organic layer pattern including a photomask including a reflecting layer and a donor substrate positioned on the photomask to be separated therefrom and including the absorption part; aligning the mask for forming the organic layer pattern and a first target substrate; and heating the absorption part by irradiating light to a rear surface of the mask for forming the organic layer pattern to form a first organic layer pattern at the first target substrate.

The photomask may include a reflecting part reflecting light incident to the photomask and a light concentrating part concentrating light to be transmitted to the donor substrate.

The reflecting part and the light concentrating part may be alternately disposed.

The transferring organic layer formed at a position corresponding to the light concentrating part among the organic layer may be transferred to the first target substrate to form the first organic layer pattern.

The method may further include: moving the photomask to overlap the light concentrating part of the photomask and the non-transferred organic layer among the organic layer of the donor substrate; aligning the mask for forming the organic layer pattern and the second target substrate with each other; and heating the absorption part by irradiating light to the mask for forming the organic layer pattern to form the second organic layer pattern at the second target substrate.

The non-transferred organic layer may be transferred to the second target substrate to form the second organic layer pattern.

The light concentrating part may include a plurality of light concentrating patterns.

A method of manufacturing an organic light emitting diode display according to an exemplary embodiment includes: forming a first switching transistor and a first driving transistor on a first target substrate; forming a first pixel electrode connected to the first driving transistor; forming a first organic emission layer on the first pixel electrode; and forming a first common electrode on the first organic emission layer. The forming of the first organic emission layer includes: coating an organic layer on an absorption part of a mask for forming an organic layer pattern including a photomask including a reflecting layer and a donor substrate positioned on the photomask to be separated therefrom and including the absorption part; aligning the mask for forming the organic layer pattern and a first target substrate formed with the first pixel electrode; and heating the absorption part by irradiating light to a rear surface of the mask for forming the organic layer pattern to form a first organic emission layer on the first pixel electrode of the first target substrate.

The photomask may include a reflecting part reflecting light incident to the photomask and a light concentrating part concentrating light to be transmitted to the donor substrate.

The reflecting part and the light concentrating part may be alternately disposed, and the transferring organic layer formed at a position corresponding to the light concentrating part among the organic layer may be transferred to the first target substrate to form the first organic emission layer.

The method may further include: forming a second switching transistor and a second driving transistor on a second target substrate; forming a second pixel electrode connected to the second driving transistor; forming a second organic emission layer on the second pixel electrode; and forming a second common electrode on the second organic emission layer. The forming of the second organic emission layer may include: moving the photomask to overlap the light concentrating part of the photomask and the non-transferred organic layer among the organic layer of the donor substrate; aligning the mask for forming the organic layer pattern and the second target substrate formed with the second pixel electrode with each other; and heating the absorption part by irradiating light to the mask for forming the organic layer pattern to form the second organic emission layer on the second pixel electrode of the second target substrate.

The non-transferred organic layer may be transferred to the second target substrate from the second organic emission layer.

The light concentrating part may include a plurality of light concentrating patterns.

In the mask for forming the organic layer pattern, the method for forming the organic layer pattern using the same, and the manufacturing method of the organic light emitting diode display according to an exemplary embodiment, by forming the reflecting layer and the absorption part at the photomask and the donor substrate that are separated from each other, and a plurality of light concentrating patterns at the donor substrate, the organic layer pattern may be formed on at least one more target substrate by using the organic layer formed once on the donor substrate such that the usage efficiency of the mask for forming the organic layer pattern may be increased and the usage amount of the organic layer material may be increased.

Also, since the reflecting layer and the absorption part are separated from each other, a delamination phenomenon that may be generated in the photomask contacting the reflecting layer and the absorption part is removed such that an additional maintenance cost is not required, thereby reducing manufacturing cost.

DETAILED DESCRIPTION

Figure 1:
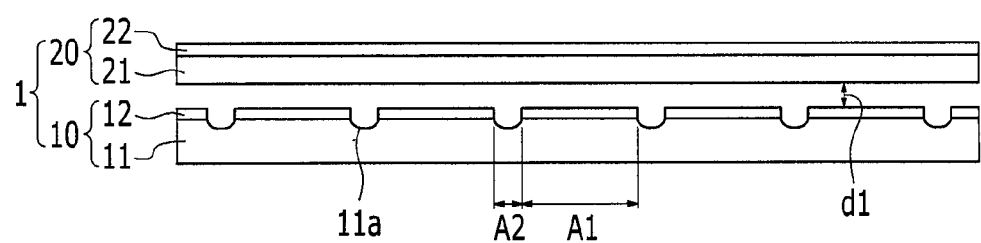
FIG. 1 is a cross-sectional view of a mask for forming an organic layer pattern according to an exemplary embodiment.

The exemplary embodiment will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Throughout this specification and the claims which follow, unless explicitly described to the contrary, the word "comprise" or variations such as "comprises" or "comprising" will be understood to imply the inclusion of stated elements but not the exclusion of any other elements. In the following description of the embodiments, it will be understood that, when an element such as a layer (film), region, pattern, or structure is referred to as being "on" or "under" another element, it can be "directly" on or under another element or can be "indirectly" formed such that an intervening element is also present. Also, terms such as "on" or "under" should be understood on the basis of the drawings. Furthermore, the expression "on" or "under" may be used herein to represent the relationship of one element to another element as illustrated in the drawings. It will be understood that this expression is intended to encompass different orientations of the elements in addition to the orientation depicted in the figures, namely, to encompass both "on" and "under".

FIG. 1 is a cross-sectional view of a mask for forming an organic layer pattern according to an exemplary embodiment.

As shown in FIG. 1, a mask 1 for forming an organic layer pattern according to an exemplary embodiment includes a photomask 10 and a donor substrate 20 separated from the photomask 10 by a first interval d1 thereon.

The photomask 10 includes a first substrate 11 and a reflecting layer 12 formed on the first substrate 11.

The first substrate 11 may have transparency such that light may be transmitted. The first substrate 11 may include a polymer material such as polyester, polyacryl, polyepoxy, polyethylene, polystyrene, and polyethylene terephthalate, or glass.

The reflecting layer 12 includes a material having high reflectance. For example, the reflection layer 12 may include at least one of aluminum (Al), silver (Ag), gold (Au), or alloys thereof.

The reflecting layer 12 may be deposited by a method such as sputtering, deposition, and plating, and may be patterned by using a patterning method such as photolithography.

The donor substrate 20 includes a second substrate 21 and an absorption layer 22 sequentially formed on the second substrate 21.

The second substrate 21 may have transparency such that light may be transmitted therethrough. The second substrate 21 may include a polymer material such as polyester, polyacryl, polyepoxy, polyethylene, polystyrene, and polyethylene terephthalate, or glass.

The absorption layer 22 absorbs light to convert it into thermal energy, and may decrease the reflectance of the light. The absorption layer 22 may include a material having a certain level of optical density and a light absorbing property. For example, the absorption layer 22 includes at least one of a metal such as molybdenum (Mo), titanium (Ti), tantalum (Ta), tungsten (W), chromium (Cr), aluminum (Al), or oxides or sulfides thereof, or alloys thereof, carbon black, graphite, or a polymer including an infrared ray dye as the light absorbing material.

The absorption layer 22 may be a single layer or multilayer. For example, the absorption layer 22 may be formed of a single layer of a metal such as molybdenum (Mo), titanium (Ti), tantalum (Ta), tungsten (W), chromium (Cr), aluminum (Al), or oxides or sulfides thereof, or alloys thereof, carbon black, graphite, or a polymer including an infrared ray dye as the light absorbing material, or may be formed of a structure in which a metal layer and a metal oxide are alternately deposited. In the case of the multilayered structure, the metal oxide may include a transparent metal oxide such as ITO, TCO, or TiO2. The multilayer may further include a passivation layer including a silicon oxide (SiOx), a silicon nitride (SiNx), or a titanium oxide (TiOx) adjacent to the metal layer.

The photomask 10 includes a reflecting part A1 reflecting the light incident to the photomask 10, and a light concentrating part A2 concentrating the light to be transmitted to the donor substrate 20. The width of the reflecting part A1 and the light concentrating part A2 may be several microns, for example, about 2 µm to about 5 µm, but is not limited thereto.

The reflecting part A1 and the light concentrating part A2 are alternately disposed, and the reflecting layer 12 is formed only at the reflecting part A1. On the surface of the first substrate 11, a light concentrating pattern 11a is formed at the light concentrating part A2, wherein the light concentrating pattern 11a may have an intaglio shape (i.e., have grooves or recesses) having a cross-section of a concave semicircular shape. The light concentrating pattern 11a functions as a lens concentrating the light, thereby focusing the light to the absorption layer 22 of the donor substrate 20. Accordingly, the absorption layer 22 of the donor substrate 20 converts the focused light energy into thermal energy such that the organic layer coated on the absorption layer 22 may be sublimated.

As described above, the organic layer formed at the position corresponding to the light concentrating pattern 11a is sublimated by using the light concentrating pattern 11a to be transferred to the target substrate, thereby forming the organic layer pattern on the target substrate.

The light concentrating pattern 11a of the mask for forming the organic layer pattern according to an exemplary embodiment is in an intaglio shape having a concave semicircular shaped cross-section. However, like the mask for forming the organic layer pattern according to another exemplary embodiment shown in FIG. 2 to FIG. 4, a light concentrating pattern 11a of various shapes may be formed and is not limited to those shown or described herein.

Figure 2:
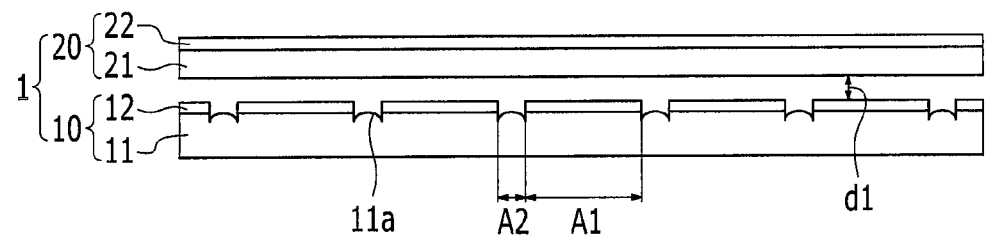
FIG. 2 is a cross-sectional view of a mask for forming an organic layer pattern according to another exemplary embodiment.
Figure 3:
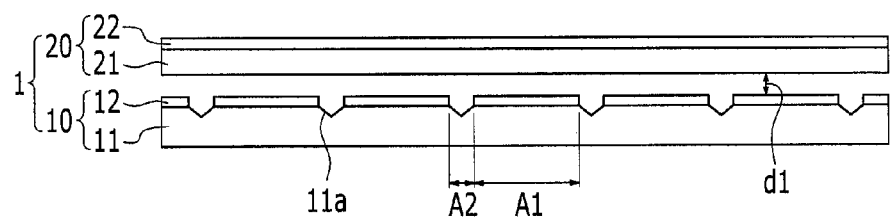
FIG. 3 is a cross-sectional view of a mask for forming an organic layer pattern according to another exemplary embodiment.
Figure 4:
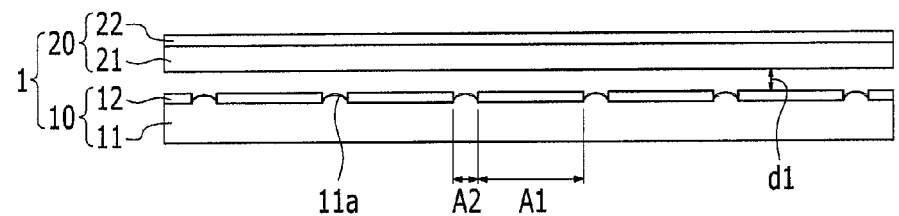
FIG. 4 is a cross-sectional view of a mask for forming an organic layer pattern according to another exemplary embodiment.

FIG. 2 is a cross-sectional view of a mask for forming an organic layer pattern according to another exemplary embodiment, FIG. 3 is a cross-sectional view of a mask for forming an organic layer pattern according to another exemplary embodiment, and FIG. 4 is a cross-sectional view of a mask for forming an organic layer pattern according to another exemplary embodiment.

As shown in FIG. 2, the light concentrating pattern 11a may have an intaglio shape having a convex semicircular shaped cross section, and as shown in FIG. 3, the light concentrating pattern 11a may have an intaglio shape having a concave triangular shaped cross section. Also, as shown in FIG. 4, the light concentrating pattern 11a may have an embossed carving shape having a convex semicircular shaped cross section. FIG. 1 to FIG. 4 show the light concentrating pattern, but it is not limited thereto, and rather may be embodied in various configurations.

Next, a method of forming an organic layer pattern by using a mask for forming an organic layer pattern according to another exemplary embodiment will be described with reference to FIG. 5 to FIG. 9.

FIG. 5 to FIG. 9 are cross-sectional views sequentially showing a method of forming an organic layer pattern by using a mask for forming an organic layer pattern according to another exemplary embodiment.

Figure 5:
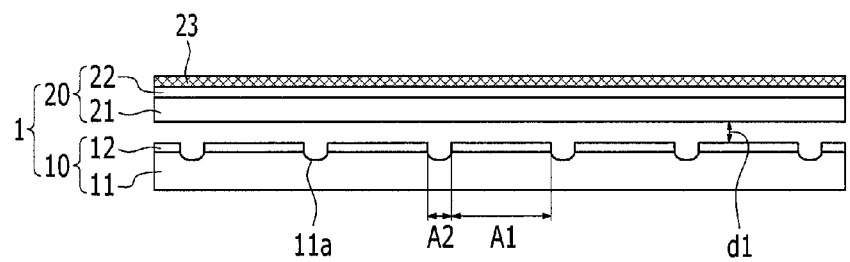
FIG. 5 to FIG. 9 are cross-sectional views sequentially showing a method of forming an organic layer pattern by using a mask for forming an organic layer pattern according to another exemplary embodiment.

First, as shown in FIG. 5, an organic layer 23 is coated on an absorption layer 22 of a donor substrate 20 of a mask 1 for forming the organic layer pattern according to an exemplary embodiment.

Figure 6:
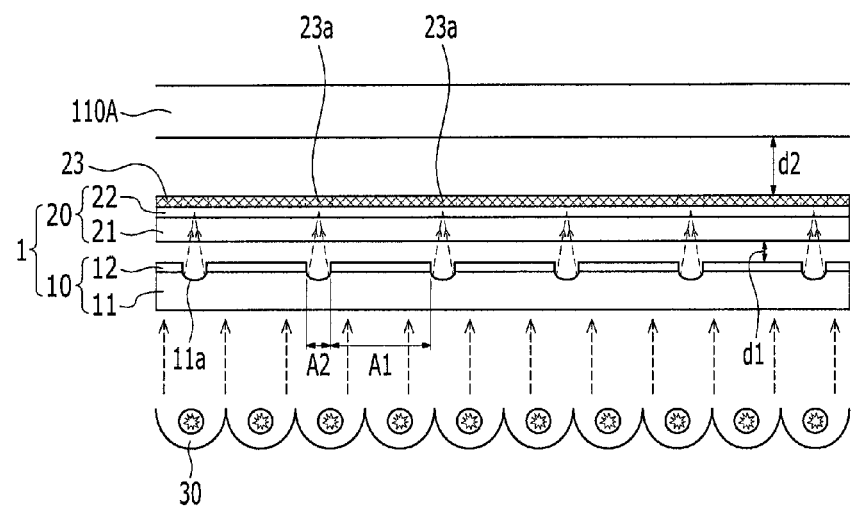

Next, as shown in FIG. 6, a first target substrate 110A to be formed with a first organic layer pattern 50A (FIG. 7) corresponds to the mask 1 for forming the organic layer pattern to be aligned. A second interval d2 between the first target substrate 110A and the mask 1 for forming the organic layer pattern may be about several microns, for example, about 3 µm, but is not limited thereto.

Next, a light source 30 such as a flash lamp, a halogen lamp, and a laser is positioned at a rear surface of the photomask 10 of the mask 1 for forming the organic layer pattern to irradiate the light. Thus, the light irradiated to the reflecting layer 12 positioned at the reflecting part A1 is reflected and the light irradiated to the light concentrating pattern 11a positioned at the light concentrating part A2 is only concentrated and focused to the absorption layer 22 of the donor substrate 20. Accordingly, the focused light energy is converted into thermal energy to heat the absorption layer 22 such that the transferring organic layer 23a positioned on or near the absorption layer 22 among the organic layer 23 is also heated.

Figure 7:
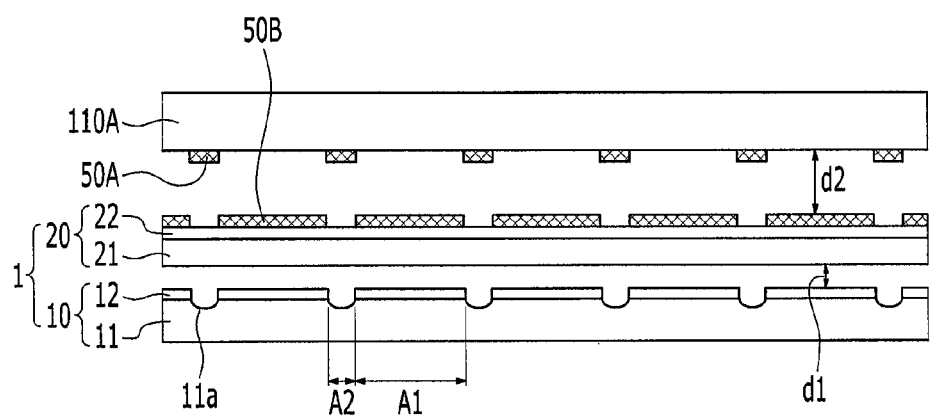

Accordingly, as shown in FIG. 7, the transferring organic layer 23a (FIG. 6) among the organic layers 23 is heated and sublimated to be transferred to the first target substrate 110A, thereby forming the first organic layer pattern 50A at the first target substrate 110A. At this time, a non-transferred organic layer 23b (FIG. 8) remains at the donor substrate 20.

Figure 8:
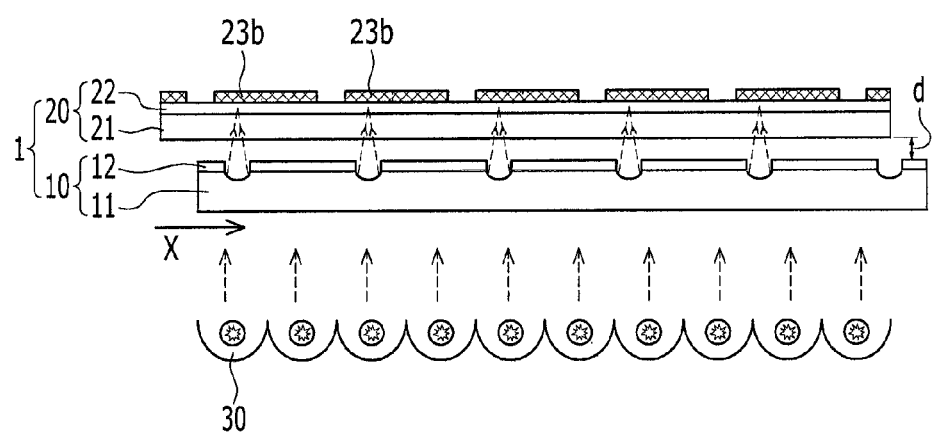

Next, as shown in FIG. 8, the photomask 10 is moved in a horizontal direction X to overlap the light concentrating part A2 of the photomask 10 and the non-transferred organic layer 23b among the organic layers of the donor substrate 20. A second target substrate 110B (FIG. 9) to be formed with a second organic layer pattern 50B corresponds to the mask 1 for forming the organic layer pattern to be aligned. Next, the light source 30 such as the flash lamp, the halogen lamp, and the laser is positioned at the rear surface of the photomask 10 of the mask 1 for forming the organic layer pattern and the light is irradiated. Thus, the light irradiated to the reflecting layer 12 positioned at the reflecting part A1 is reflected and the light irradiated to the light concentrating pattern 11a positioned at the light concentrating part A2 is concentrated and focused to the absorption layer 22 of the donor substrate 20. Accordingly, the focused light energy is converted into thermal energy to heat the absorption layer 22. At this time, the non-transferred organic layer 23b is positioned on the heated absorption layer 22.

Figure 9:
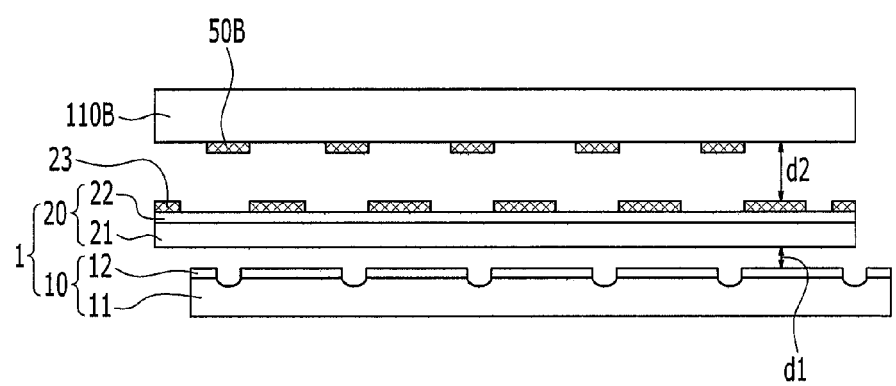

Next, as shown in FIG. 9, the non-transferred organic layer 23b (FIG. 8) among the organic layers 23 is sublimated and transferred to the second target substrate 110B such that the second organic layer pattern 50B is formed on the second target substrate 110B.

As described above, one sheet donor substrate formed with the organic layer is used to form the organic layer pattern on at least one target substrate such that the application efficiency of the mask for forming the organic layer pattern may be increased and the usage amount of the organic layer material may be increased.

A manufacturing method of an organic light emitting diode display using a mask for forming according to an exemplary embodiment will be described with reference to FIG. 10 to FIG. 16 along with the above-described drawings.

FIG. 10 to FIG. 16 are cross-sectional views sequentially showing a manufacturing method of an organic light emitting diode display using a mask for forming according to an exemplary embodiment.

Figure 10:
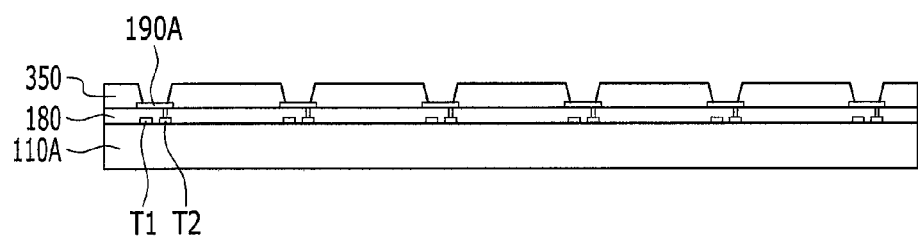
FIG. 10 to FIG. 16 are cross-sectional views sequentially showing a manufacturing method of an organic light emitting diode display using a mask for forming according to an exemplary embodiment.

First, as shown in FIG. 10, a first switching transistor T1 and a first driving transistor T2 are formed on a first target substrate 110A, and a passivation layer 180 covering the first switching transistor T1 and the first driving transistor T2 is formed thereon. Also, a first pixel electrode 190A connected to the first driving transistor T2 is formed. Further, a pixel definition layer 350 covering an edge of the first pixel electrode 190A and the passivation layer 180 is formed.

Next, a first organic emission layer 270A (FIG. 12) is formed on the first pixel electrode 190A. The step of forming the first organic emission layer 270A is similar to the step of forming the first organic layer pattern 50A.

Figure 11:
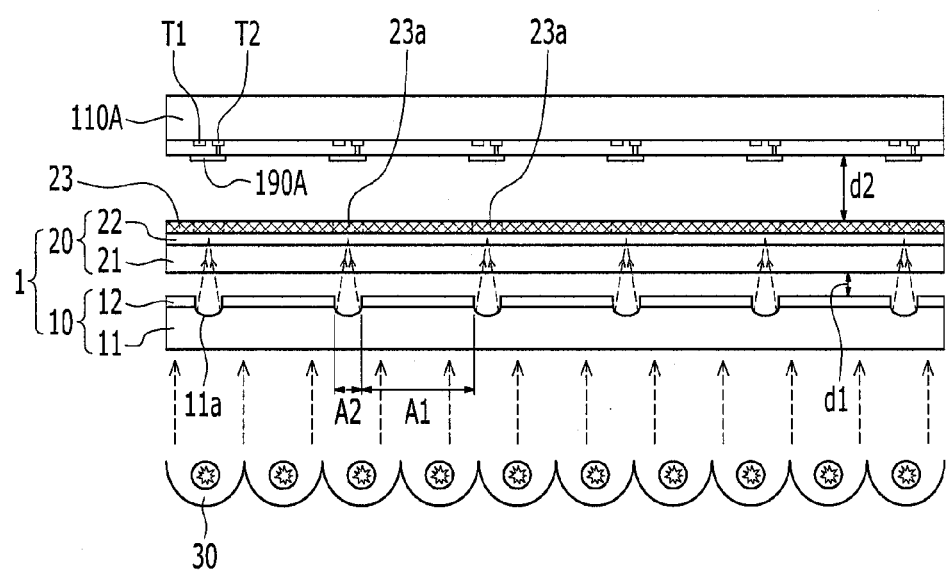

As shown in FIG. 11, the organic layer 23 is coated on the absorption layer 22 of the donor substrate 20 of the mask 1 of the organic layer pattern. Also, the first target substrate 110A to be formed with the first organic emission layer 270A is aligned corresponding to the mask 1 for forming the organic layer pattern. Further, the light source 30 is positioned at the rear surface of the photomask 10 of the mask 1 for forming the organic layer pattern and the light is irradiated. Thus, the light irradiated to the reflecting layer 12 positioned at the reflecting part A1 is reflected, and the light irradiated to the light concentrating pattern 11a positioned at the light concentrating part A2 is only concentrated and focused to the absorption layer 22 of the donor substrate 20. Accordingly, the focused light energy is converted into thermal energy and then heats the absorption layer 22 such that the transferring organic layer 23a positioned on or near the absorption layer 22 among the organic layer 23 is also heated.

Figure 12:
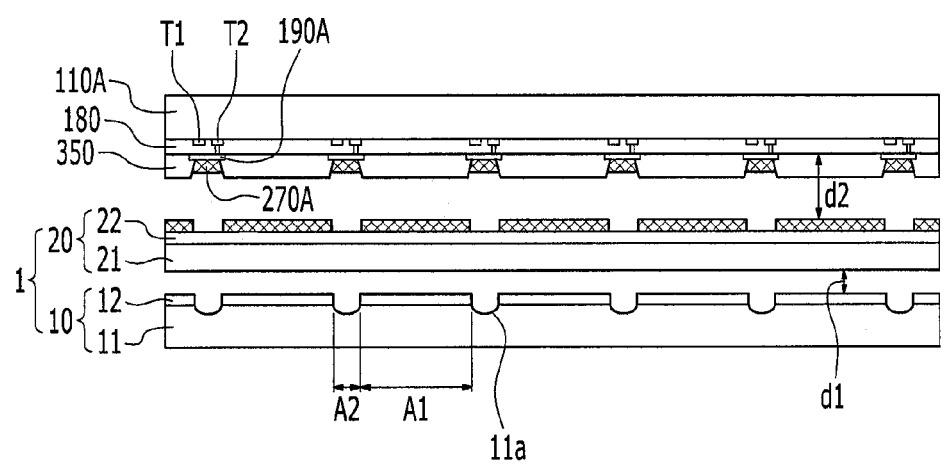

Accordingly, as shown in FIG. 12, the transferring organic layer 23a (FIG. 11) among the organic layers 23 is heated and sublimated to be transferred to the first target substrate 110A, thereby forming the first organic emission layer 270A at the first target substrate 110A.

Figure 13:
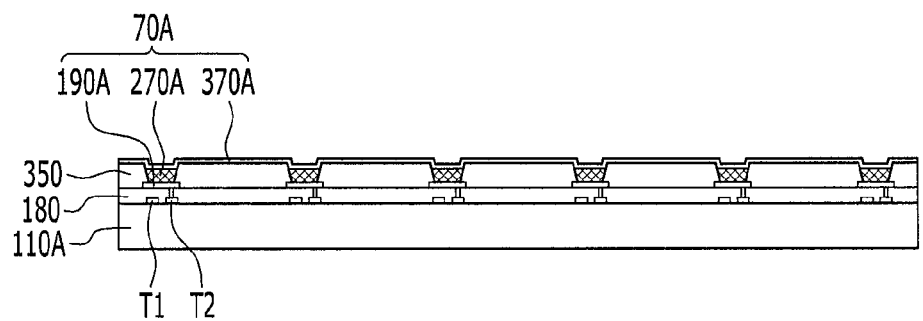

Next, as shown in FIG. 13, a first common electrode 370A is formed on the first organic emission layer 270A, thereby completing a first organic light emitting diode 70A including the first pixel electrode 190A, the first organic emission layer 270A, and the first common electrode 370A.

Figure 14:
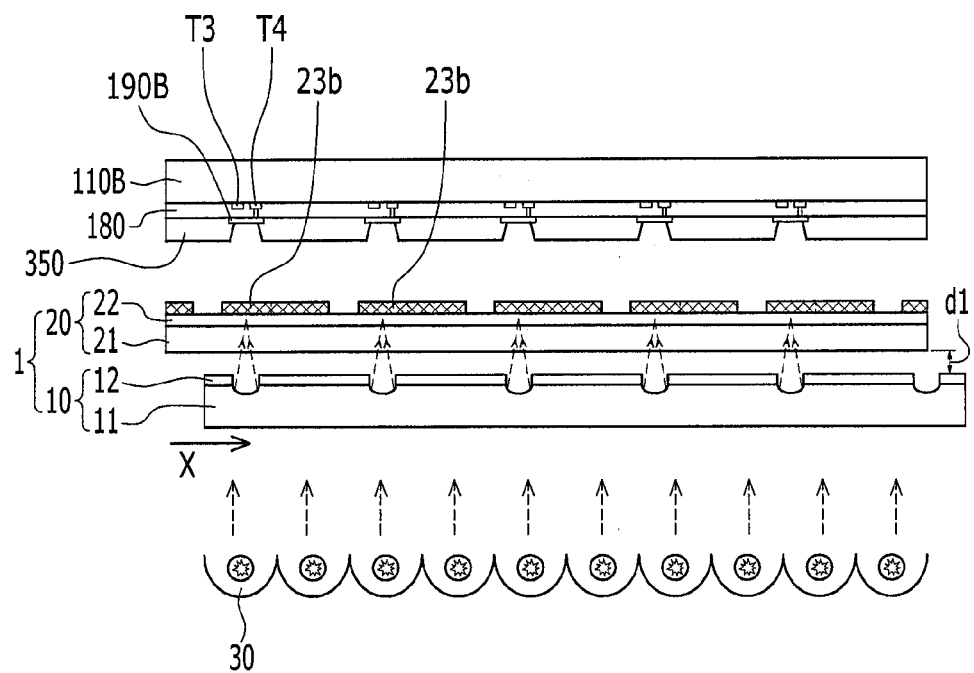

Next, as shown in FIG. 14, the photomask 10 is moved in the horizontal direction X to overlap the light concentrating part A2 of the photomask 10 and the non-transferred organic layer 23b among the organic layer 23 of the donor substrate 20. Also, the second target substrate 110B to be formed with a second organic emission layer 270B is aligned corresponding to the mask 1 for forming the organic layer pattern. The second switching transistor T3 and the second driving transistor T4 are formed at the second target substrate 110B, and a passivation layer 180 covering the second switching transistor T3 and the second driving transistor T4 is formed. Also, a second pixel electrode 190B connected to the second driving transistor T4 is formed. Further, the pixel definition layer 350 covering the edge of the first pixel electrode 190A and the passivation layer 180 is formed.

In addition, the light source 30 is positioned at the rear surface of the photomask 10 of the mask 1 for forming the organic layer pattern and the light is irradiated. Thus, the light irradiated to the reflecting layer 12 positioned at the reflecting part A1 is reflected, and the light irradiated to the light concentrating pattern 11a positioned at the light concentrating part A2 is only concentrated and focused to the absorption layer 22 of the donor substrate 20. Accordingly, the focused light energy is converted into thermal energy and then heats the absorption layer 22 such that the non-transferred organic layer 23b positioned on or near the absorption layer 22 among the organic layer 23 is also heated.

Figure 15:
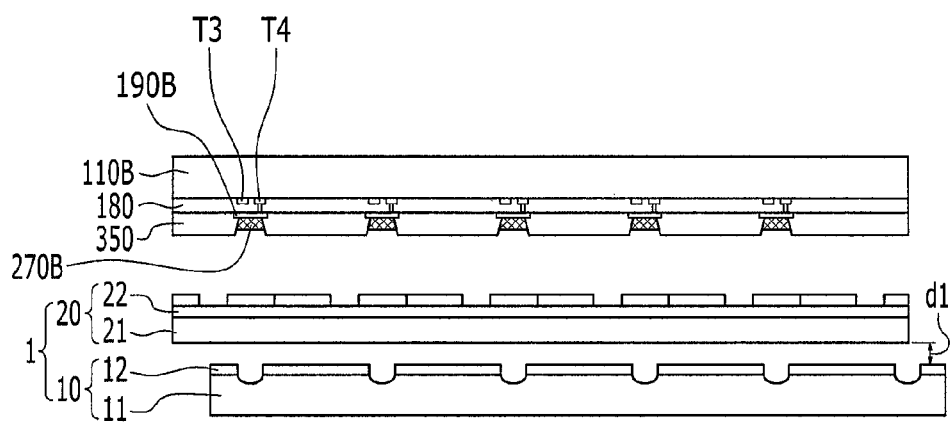

Accordingly, as shown in FIG. 15, the non-transferred organic layer 23b (FIG. 14) among the organic layers 23 is sublimated and transferred to the second target substrate 110B, thereby forming the second organic emission layer 270B at the second target substrate 110B.

As described above, one sheet donor substrate formed with the organic layer is used to form the organic layer pattern on at least one target substrate such that the application efficiency of the mask for forming the organic layer pattern may be increased and the usage amount of the organic layer material may be increased.

Figure 16:
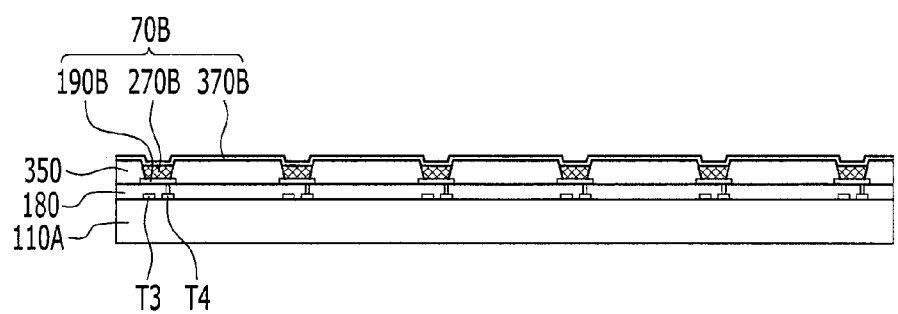

Also, as shown in FIG. 16, a second common electrode 370B is formed on the second organic emission layer 270B, thereby completing a second organic light emitting diode 70B including the second pixel electrode 190B, the second organic emission layer 270B, and the second common electrode 370B.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 1: mask for forming an organic layer pattern | 10: photomask |
| 11: first substrate | 11a: light concentrating pattern |
| 12: reflecting layer | 20: donor substrate |
| 21: second substrate | 22: absorption part |
| 23: organic layer | 30: light source |
| 50A: first organic layer pattern | 50B: second organic layer pattern |

What is claimed is:

1. A mask for forming an organic layer pattern, the mask comprising:
   a photomask comprising a first substrate and a reflecting layer on the first substrate; and
   a donor substrate spaced from the photomask, the donor substrate including a second substrate and an absorption part on the second substrate,
   wherein the photomask comprises a reflecting part configured to reflect light incident to the photomask and wherein the first substrate includes a light concentrating part configured to concentrate light and transmit the light to the donor substrate such that an organic layer on the absorption par on the second substrate can be transferred to a third substrate.

2. The mask of claim 1, wherein the reflecting part and the light concentrating part are alternately disposed.

3. The mask of claim 1, wherein a plurality of light concentrating patterns are formed at the light concentrating part at a surface of the first substrate.

4. The mask of claim 3, wherein the light concentrating pattern has an intaglio shape.

5. The mask of claim 4, wherein the intaglio shape has a concave semicircular shaped cross section.

6. The mask of claim 4, wherein the intaglio shape has a convex semicircular shaped cross section.

7. The mask of claim 4, wherein the intaglio shape has a triangular shaped cross section.

8. The mask of claim 3, wherein the light concentrating pattern has an embossed carving shape.

9. The mask of claim 8, wherein the embossed carving shape has a convex semicircular shape.

10. The mask of claim 3, wherein the reflecting layer is formed at the reflecting part.

\* \* \* \* \*